United States Patent
Vice

(10) Patent No.: US 7,197,293 B2
(45) Date of Patent: Mar. 27, 2007

(54) ABSORBING SUM SIGNAL ENERGY IN A MIXER

(75) Inventor: Michael W. Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 439 days.

(21) Appl. No.: 10/639,176

(22) Filed: Aug. 11, 2003

(65) Prior Publication Data

US 2005/0037726 A1 Feb. 17, 2005

(51) Int. Cl.
*H04B 1/26* (2006.01)
*H04B 1/10* (2006.01)

(52) U.S. Cl. .................. 455/326; 455/296; 455/304; 455/306

(58) Field of Classification Search ............... 455/326, 455/333, 334, 339, 341, 296, 293, 130, 137, 455/140, 276.1, 278.1, 295, 306, 304
See application file for complete search history.

(56) References Cited

U.S. PATENT DOCUMENTS

| | | | | | |
|---|---|---|---|---|---|
| 4,349,789 | A | * | 9/1982 | Kurihara | 331/4 |
| 5,674,698 | A | * | 10/1997 | Zarling et al. | 435/7.92 |
| 5,732,325 | A | * | 3/1998 | Dent et al. | 455/13.3 |
| 5,981,957 | A | * | 11/1999 | Cruce et al. | 250/458.1 |
| 6,157,037 | A | * | 12/2000 | Danielson | 250/458.1 |
| 6,654,595 | B1 | * | 11/2003 | Dexter | 455/323 |

* cited by examiner

*Primary Examiner*—Tony T. Nguyen

(57) ABSTRACT

A frequency mixer that generates out of phase sum signals and uses the out of phase relationship to absorb sum signal energy in an energy absorbing component. A frequency mixer according to the present teachings includes a set of mixing devices that generate a first sum signal and a second sum signal in response to an input signal and a drive signal such that the first sum signal is out of phase in relation to the second sum signal. A frequency mixer according to the present teachings includes an energy absorbing component that absorbs the out of phase sum terms from the mixing devices.

22 Claims, 2 Drawing Sheets

ABSORBING SUM SIGNAL ENERGY IN A MIXER

BACKGROUND

Frequency mixers may be employed in a variety of electronic systems. For example, frequency mixers may be employed in radio systems to down convert a received radio frequency (RF) signal by combing the received radio frequency (RF) signal with a local oscillator (LO) signal. The combination of an input signal and an LO signal in a frequency mixer may yield an intermediate frequency (IF) signal having a frequency that corresponds to the difference between the frequencies of the input and LO signals.

In addition, the combination of an input signal and an LO signal in a frequency mixer may yield a sum signal having a frequency that corresponds to the sum of the frequencies of the input and LO signals. The sum signal may be ignored as an unwanted byproduct of a frequency mixer that is designed to yield an IF signal. Unfortunately, the sum signal may reflect back and re-enter into a mixing device and cause a degradation the performance of a frequency mixer.

Prior frequency mixers may include filter circuits that are designed to steer the sum signal to a load resistor that dissipates the energy of the sum signal. For example, a prior frequency mixer may include a diplex filter or a triplex filter coupled to the output port of the mixer. Unfortunately, a diplex filter may not have sufficient bandwidth to capture a sum signal, particularly in the case of a double balanced mixer. A triplex filter may be used in a single balanced mixer but the design of a triplex filter may be relatively complex, may require additional components, and compromise the performance of a frequency mixer.

SUMMARY OF THE INVENTION

A frequency mixer is disclosed that generates out of phase sum signals and uses the out of phase relationship to absorb sum signal energy in an energy absorbing component. A frequency mixer according to the present teachings includes a set of mixing devices that generate a first sum signal and a second sum signal in response to an input signal and a drive signal such that the first sum signal is out of phase in relation to the second sum signal. A frequency mixer according to the present teachings includes an energy absorbing component that absorbs the out of phase sum terms from the mixing devices.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
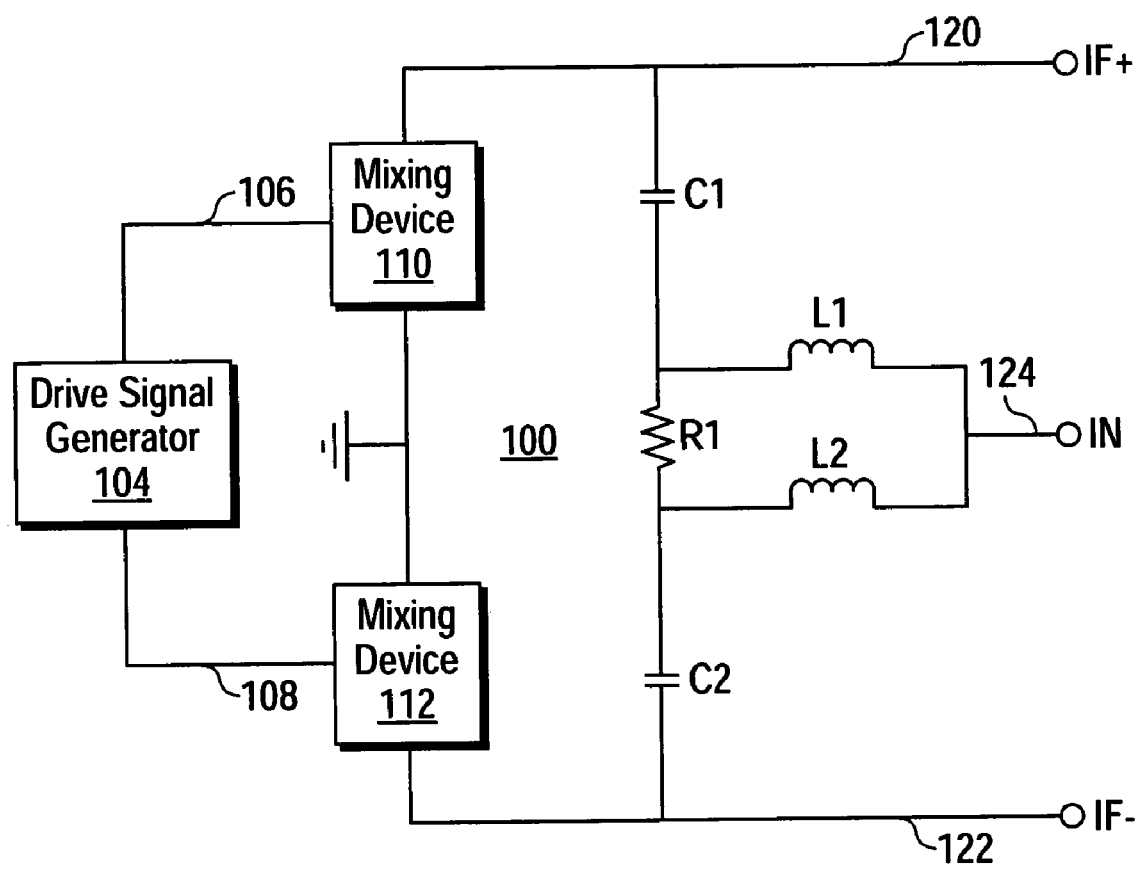
FIG. 1 shows a frequency mixer according to the present teachings.

FIG. 1 shows a frequency mixer 100 according to the present teachings. The frequency mixer 100 includes a pair of mixing devices 110–112 that are driven by a drive signal generator 104. The drive signal generator 104 generates a drive signal 106 to the mixing device 110 that is out of phase from a drive signal 108 to the mixing device 112.

The mixing device 110 generates a sum signal and a difference signal on an output node 120 in response to the drive signal 106 and an input signal on an input node 124. The mixing device 112 generates a sum signal and a difference signal on an output node 122 in response to the drive signal 108 and the input signal on the input node 124.

The frequency mixer 100 includes a pair of capacitors C1 and C2 having values that are selected to cause the sum signals on the output nodes 120–122 to be dissipated in an energy absorbing component, e.g. a resistor R1. The frequency mixer 100 includes a pair of inductors L1 and L2 that are selected to appear as open circuits at the frequency of the sum signals and prevent escape of sum signal energy to the input node 124.

Both ends of the resistor R1 have substantially equal potentials at the frequency of the input signal. Thus, there is no substantial current through the resistor R1 at the frequency of the input signal. On the other hand, the sum signals at opposite ends of the resistor R1 are out of phase. Thus, sum signal energy flows through and is dissipated in the resistor R1.

The product of the values of the capacitor C1 and the inductor L1 determines the frequency of energy flow from the input port 124 through the inductor L1 and the capacitor C1 to the output node 120. The values of the capacitor C1 and the inductor L1 are selected so that their product passes the desired frequency of the input signal on the input node 124.

The frequency mixer 100 dissipates sum signal energy in the resistor R1 and avoids reflections of sum signal energy using the resistor R1 and proper selection and arrangement of the remaining components. The frequency mixer 100 also improves port match at the input node 124 by absorbing sum energy thereby preventing sum signal energy from re-entering the mixing devices and re-converting back to the input frequency energy and emerging from the input node 124.

Figure 2:
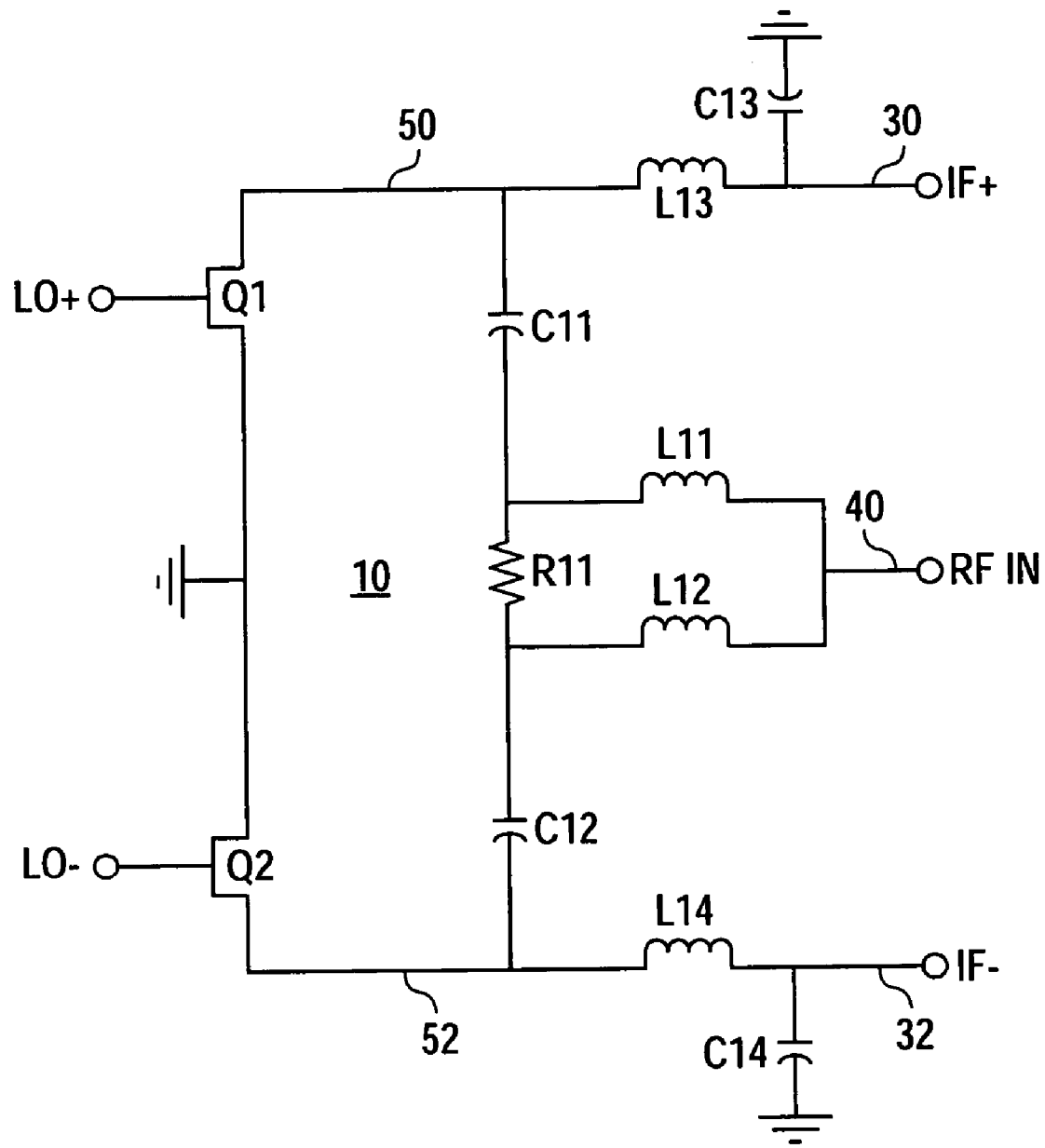
FIG. 2 shows another frequency mixer according to the present teachings.

FIG. 2 shows a frequency mixer 10 according to the present teachings. The frequency mixer 10 is a single balanced mixer that includes a pair of transistors Q1 and Q2 that function as mixing devices. The transistors Q1 and Q2 in one embodiment are field effect transistors (FETs). In other embodiments, the transistors Q1 and Q2 may be bipolar junction transistors (BJTs) or diodes.

The frequency mixer 10 includes an intermediate frequency port 30 (IF+), an intermediate frequency port 32 (IF−), and a radio frequency (RF) port 40. The gates of the transistors Q1 and Q2 are driven by a local oscillator signal LO+ and a local oscillator signal LO−, respectively.

The transistor Q1 combines the local oscillator signal LO+ with an RF signal received at the RF port 40. The IF+ port 30 carries the difference term generated by the transistor Q1. Similarly, the transistor Q2 combines the local oscillator signal LO− with the RF signal received at the RF port 40. The IF− port 32 carries the difference term generated by the transistor Q2.

An inductor L13 and a capacitor C13 provide a low pass filter between an output node 50 of the mixing transistor Q1 and the IF+ port 30. A capacitor C11 and an inductor L11 provide a band pass filter from the output node 50 to the RF port 40. Similarly, an inductor L14 and a capacitor C14 provide a low pass filter between an output node 52 of the mixing transistor Q2 and the IF− port 32, and a capacitor C12 and an inductor L12 provide a band pass filter from the output node 52 to the RF port 40.

The local oscillator signals LO+ and LO– are complementary phase signals that have a 180 degree phase relationship with respect to one another. As a consequence, the difference term generated by the transistor Q1 is 180 degree out of phase with respect to the difference term generated by the transistor Q2. Thus, the signal at the IF+ port 30 is 180 degree out of phase with respect to the signal at the IF– port 32.

The values for the capacitors C11 and C12 and the inductors L11 and L12 are selected so that the sum signals at the output nodes 50 and 52 are absorbed by a resistor R11. The inductors L11 and L12 are selected to be large enough to appear as open circuits at the frequency of the sum signals. This prevents escape of sum term energy through the inductors L11 and L12. The capacitors C11 and C12 are selected to be large enough to couple the sum signals at the output nodes 50 and 52 to the resistor R11 efficiently. The values of capacitors C11 and C12 and the inductors L11 and L12 and the resistor R11 are chosen to provide an impedance matched termination of sum signal energy.

The product of the values of the capacitor C11 and the inductor L11 determines the frequency of energy flow from the RF port 40, through the inductor L11 and the capacitor C11, to the drain of the transistor Q1 at the output node 50. The values of the capacitor C11 and the inductor L11 are selected so that their product passes RF frequencies. The values of the capacitor C12 and the inductor L12 are selected so that their product passes RF frequencies.

Both ends of the resistor R11 have substantially equal RF potentials. Thus, there is no substantial RF current through the resistor R11. On the other hand, the sum signals at opposite ends of the resistor R1 are 180 degrees out of phase. Thus, sum signal energy flows through and is dissipated in the resistor R11.

The value of the inductor L11 may be equal to the value of the inductor L12, and the value of the capacitor C11 may be equal to the value of the capacitor C12.

It will be appreciated that the RF signal appears at each of the mixing devices Q1 and Q2 at the same phase angle, i.e. in phase. The IF signal emerging from the transistor Q1 is filtered by the low pass filter composed of the inductor L13 and the capacitor C13, and appears at the IF+ port 30. In a similar manner, the IF signal from the transistor Q12 is filtered by the inductor L14 and the capacitor C14, and appears at the IF– port 32.

The sum signal also emerges from the mixing transistors Q1 and Q2 in an opposite phase condition, but cannot pass through the IF low pass filters. Instead, the sum signal passes though the capacitors C11 and C12 and is terminated by sum the absorbing resistor R11. The sum signal is transformed up in impedance by the capacitor C11 and the inductor L11, as well as by the capacitor C12 and the inductor L12. The degree of impedance transformation is determined by the values of C11, C12, L11, and L12. The value of the resistor R11 is chosen to match the transformed impedance of the sum signal so that it is efficiently absorbed.

The resistor R11 does not degrade the RF signal path because it is connected to two nodes that are at equal RF potential. The effective sum termination without RF signal degradation is possible because the RF energy enters the structure in common mode, while the sum signal exits the mixing transistors Q1 and Q2 in differential mode. This may be referred to as mode conversion, and it affords complete isolation of the RF signal from the sum termination resistor R11.

The filtering of the RF signal from the IF signal using the inductors L13, L14 and the capacitors C13, C14 may in other embodiments be performed by other arrangements of components.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A frequency mixer, comprising:
   a set of mixing devices that generate a first sum signal and a second sum signal in response to an input signal and a drive signal, the mixing devices generating the first sum signal 180 degrees out of phase in relation to the second sum signal;
   circuit for applying the out of phase sum signals to an energy absorbing component.

2. The frequency mixer of claim 1, wherein the circuit for applying comprises a circuit for applying the out of phase sum signals to opposite terminals of the energy absorbing component.

3. The frequency mixer of claim 1, farther comprising a set of filters that prevent the sum signals from reaching a pair of intermediate frequency nodes of the frequency mixer.

4. The frequency mixer of claim 1, further comprising a set of components that are selected to prevent the sum signals from reaching an input node of the frequency mixer.

5. The frequency mixer of claim 1, further comprising a set of components that are selected to pass the input signal to the mixing devices.

6. The frequency mixer of claim 5, wherein a value for each component is selected in response to a desired frequency of the input signal.

7. A frequency mixer, comprising:
   drive signal generator that generates a first drive signal and a second drive signal that is out of phase in relation to the first drive signal;
   first mixing device that generates a first sum signal in response to an input signal and the first drive signal;
   second mixing device that generates a second sum signal in response to the input signal and the second drive signal;
   circuit for absorbing the sum signals from the first and second mixing devices;
   wherein the first sum signal and the second sum signal are 180 degrees out of phase.

8. The frequency mixer of claim 7, wherein the circuit for absorbing includes an energy absorbing component coupled between the sum signals, a relative phase difference between the sum signals causing the energy absorbing component to absorb the energy of the sum signals.

9. The frequency mixer of claim 8, wherein the circuit for absorbing includes a set of components for applying the sum signals to the energy absorbing component.

10. The frequency mixer of claim 7, wherein the circuit for absorbing includes a set of components that are selected to prevent the sum signals from reaching an input node to the frequency mixer.

11. The frequency mixer of claim 7, wherein the circuit for absorbing includes a set of components that are selected to pass the input signal to the mixing devices.

12. The frequency mixer of claim 7, further comprising a set of filters that prevent the sum signals from reaching a pair of intermediate frequency nodes of the frequency mixer.

13. A method for dissipating a sum signal energy in a frequency mixer, comprising:

generating a first sum signal and a second sum signal in response to an input signal and a drive signal, the first sum signal 180 degrees out of phase in relation to the second sum signal;

dissipating the sum signal energy by applying the out of phase sum signals to an energy absorbing component.

14. The method of claim 13, wherein applying comprises applying the out of phase sum signals to opposite terminals of the energy absorbing component.

15. The method of claim 13, further comprising preventing the sum signals from reaching a pair of intermediate frequency nodes of the frequency mixer.

16. The method of claim 13, further comprising preventing the sum signals from reaching an input node of the frequency mixer.

17. The method of claim 13, further comprising selecting a set of components for obtaining the input signal.

18. The method of claim 17, wherein selecting includes selecting a value for each component in response to a desired frequency of the input signal.

19. A frequency mixer, comprising:
a first mixing device responsive to a first drive signal to generate a first sum signal, the first drive signal being 180 degrees out of phase with a second drive signal;
a second mixing device responsive to the second drive signal to generate a second sum signal, the first sum signal being 180 degrees out of phase with the second sum signal;
an energy absorbing component having a first terminal and a second terminal, the first terminal operably connected to receive the first sum signal and the second terminal operably connected to receive the second sum signal;
a first band pass filter operably connected to pass an input signal from an RF input to a first output node and block the first sum signal from the RF input; and
a second band pass filter operably connected to pass the input signal from the RF input to a second output node and block the second sum signal from the RF input.

20. The frequency mixer of claim 19, further comprising a drive signal generator generating the first drive signal and the second drive signal.

21. The frequency mixer of claim 19, wherein the energy absorbing component is a resistor.

22. The frequency mixer of claim 19, further comprising a first low pass filter operably connected between the first mixing device and the first output node, and a second low pass filter operably connected between the second mixing device and the second output node.

* * * * *

UNITED STATES PATENT AND TRADEMARK OFFICE
CERTIFICATE OF CORRECTION

PATENT NO. : 7,197,293 B2 Page 1 of 1
APPLICATION NO. : 10/639176
DATED : March 27, 2007
INVENTOR(S) : Michael Vice It is certified that error appears in the above-identified patent and that said Letters Patent is hereby corrected as shown below:

(Column 4 Line 23) In Claim 3, delete "farther" and insert -- further --, therefor.

Signed and Sealed this

Thirtieth Day of December, 2008

JON W. DUDAS
*Director of the United States Patent and Trademark Office*